(12) United States Patent
Yamamoto

(10) Patent No.: US 10,573,490 B2
(45) Date of Patent: Feb. 25, 2020

(54) ION SOURCE AND ION IMPLANTATION APPARATUS

(71) Applicant: Nissin Ion Equipment Co., Ltd., Kyoto-shi, Kyoto (JP)

(72) Inventor: Tetsuro Yamamoto, Kyoto (JP)

(73) Assignee: Nissin Ion Equipment Co., Ltd., Kyoto-shi, Kyoto (JP)

( * ) Notice: Subject to any disclaimer, the term of this patent is extended or adjusted under 35 U.S.C. 154(b) by 0 days.

(21) Appl. No.: 16/224,910

(22) Filed: Dec. 19, 2018

(65) Prior Publication Data

US 2019/0326089 A1    Oct. 24, 2019

(30) Foreign Application Priority Data

Feb. 9, 2018    (JP) .................. 2018-021919

(51) Int. Cl.
    *H01J 37/317*    (2006.01)
    *H01J 37/147*    (2006.01)
    *H01J 37/08*    (2006.01)

(52) U.S. Cl.
    CPC .......... *H01J 37/3171* (2013.01); *H01J 37/08* (2013.01); *H01J 37/1472* (2013.01); *H01J 2237/0835* (2013.01); *H01J 2237/24542* (2013.01); *H01J 2237/31701* (2013.01)

(58) Field of Classification Search
    CPC .... H01J 37/3171; H01J 37/08; H01J 37/1472; H01J 2237/0835; H01J 2237/24542; H01J 2237/31701
    USPC .................. 250/492.1, 492.2, 492.22, 492.3
    See application file for complete search history.

(56) References Cited

U.S. PATENT DOCUMENTS 7,078,714 B2    7/2006    Maeno et al.
9,734,982 B1    8/2017    Hahto et al.

FOREIGN PATENT DOCUMENTS

JP    2006-313750 A    11/2006

*Primary Examiner* — Nicole M Ippolito
*Assistant Examiner* — Hanway Chang
(74) *Attorney, Agent, or Firm* — Sughrue Mion, PLLC

(57) ABSTRACT

An ion source for improving beam transport efficiency regarding a ribbon beam is provided. The plasma generation container is formed with a beam extraction port at an end thereof. The shielding member plugs the beam extraction port and comprises three or more elongate holes each of which is long in a lateral direction of a ribbon beam to be extracted through the shielding member and which are arranged in the form of an array extending in the lateral direction, wherein a first length one of the elongate holes located in a central region of the array is shorter than a second length of one of the remaining elongate holes located on an end side of the array.

14 Claims, 6 Drawing Sheets

ION SOURCE AND ION IMPLANTATION APPARATUS

CROSS-REFERENCE TO RELATED APPLICATION

This application claims priority from Japanese Patent Application No. JP2018-021919, filed in the Japanese Patent Office on Sep. 2, 2018, the disclosure of which is incorporated by reference herein in its entirety.

BACKGROUND

1. Field

Exemplary embodiments relate to an ion source configured to extract a ribbon beam therefrom, and an ion implantation apparatus equipped with the ion source.

2. Description of Related Art

In recent years, a ribbon-shaped ion beam (hereinafter referred to as "ribbon beam") which is long in one direction has been used to meet the demand for larger board size, larger beam current or the like. For example, a ribbon beam may be relatively long in a lateral direction and relatively short in a width (or thickness) direction thereof.

As an example of an ion implantation apparatus capable of handling such a ribbon beam, there is an ion implantation apparatus described in JP 2006-313750A. This ion implantation apparatus comprises a magnetic lens for uniforming a beam current density distribution in a lateral direction of the ribbon beam. This magnetic lens has a function of locally deflecting the ribbon beam in a region having a relatively large beam current toward a region having a relatively small current.

An ion beam composed of positive ions is a positively electrically charged beam. In the ribbon beam, a potential (beam potential) tends to become higher in a central region of the ribbon beam than in each of opposed lateral edge regions of the ribbon beam, even when the beam current is the same at any position in the lateral direction of the ribbon beam.

In a transport path of the positive ion beam, electrons are supplied from an electron source, for example a plasma flood gun or the like, in order to suppress divergence of the ion beam due to the space charge effect. Many of the electrons in the transport path are drawn toward the central region of the ribbon beam having a relatively high beam potential, so that the effect of suppressing the divergence due to the space charge effect becomes stronger toward the central region of the ribbon beam. As a result, the ribbon beam largely diverges in the lateral edge regions of the ribbon beam where the divergence-suppressing effect is relatively weak, and the beam current becomes smaller as compared to the central region of the ribbon beam.

In the course of transportation to the magnetic lens, the lateral edge regions of the ribbon beam subjected to a strong diverging effect will come into collision with a chamber wall surface defining part of the beam transport path or with other beam optical element disposed in the beam transport path, resulting in disappearance. In uniformity adjustment, the magnetic lens is operable to locally deflect the central region of the ribbon beam largely so as to compensate for a beam current in the lateral edge regions of the ribbon beam where the ribbon beam has partially disappeared. Thus, a large deviation will occur in distribution of traveling directions of the ribbon beam, at positions in the lateral direction of the ribbon beam, although it is possible to achieve uniformity in beam current in the lateral direction of the ribbon beam.

SUMMARY

It is an aspect to provide an ion source for improving beam transport efficiency regarding a ribbon beam, and an ion implantation apparatus equipped with the ion source.

According to an aspect of one or more exemplary embodiments, there is provided an ion source which comprises a plasma generation container formed with a beam extraction port at an end thereof, and a shielding member plugging the beam extraction port and comprising three or more elongate holes each of which is long in a lateral direction of a ribbon beam to be extracted through the shielding member and which are arranged in the form of an array extending in the lateral direction, wherein a first length one of the elongate holes located in a central region of the array is shorter than a second length of one of the remaining elongate holes located on an end side of the array.

BRIEF DESCRIPTION OF THE DRAWINGS

The above and/or other aspects will become apparent and more readily appreciated from the following description of example embodiments, taken in conjunction with the accompanying drawings of which.

DETAILED DESCRIPTION

Figure 1:
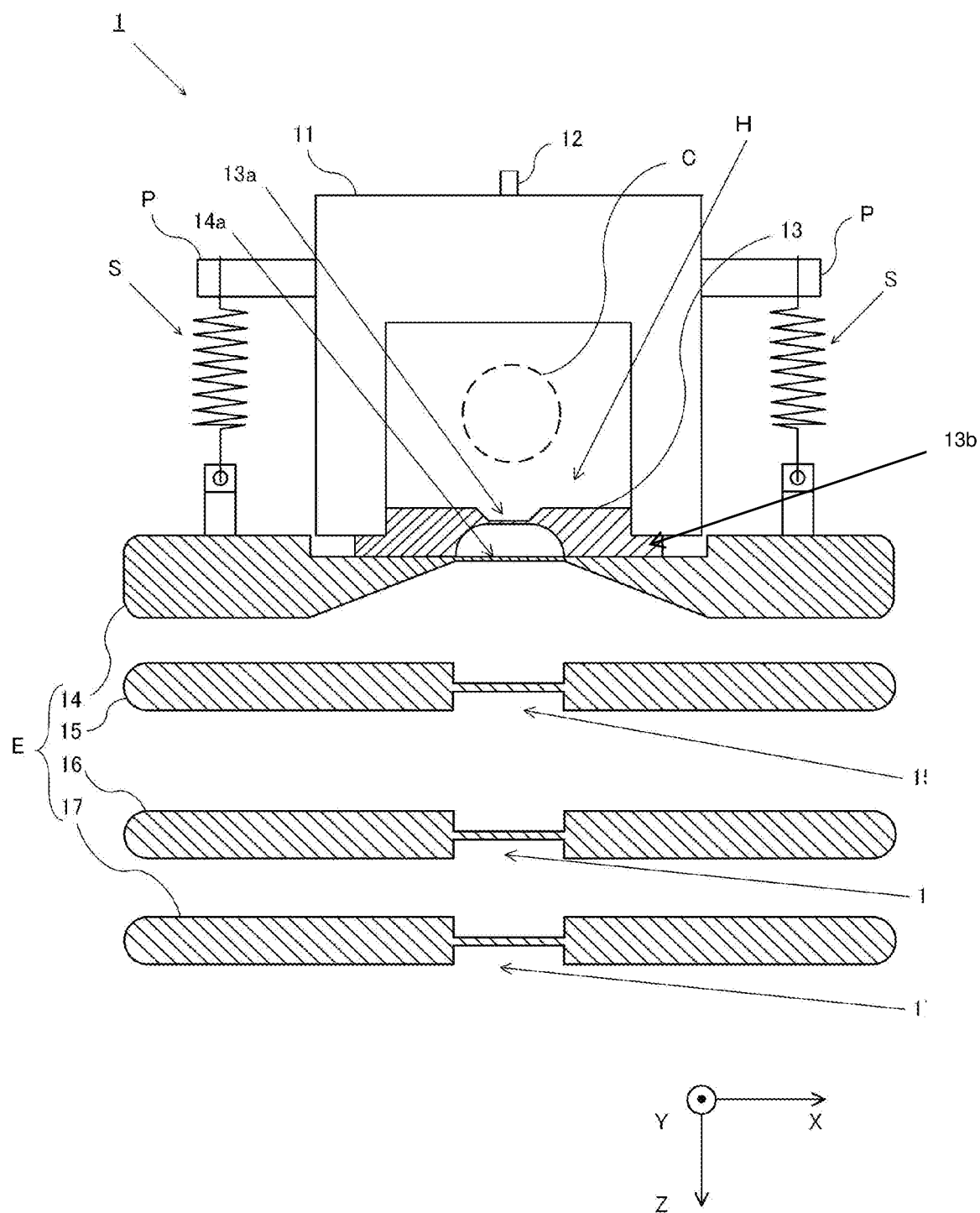
FIG. 1 is a cross-sectional view of an ion source according to an exemplary embodiment.

The exemplary embodiments of the present disclosure may be diversely modified. However, it is to be understood that the present disclosure is not limited to a specific exemplary embodiment, but includes all modifications, equivalents, and substitutions without departing from the scope and spirit of the present disclosure and claims.

In an ion source according to various exemplary embodiments, elongate holes are formed in a shielding member, and a length of one of the elongate holes located in the central region of the shielding member is set to be shorter than that of one of the remaining elongate holes located on an end portion of the shielding member, so that a beam current becomes relatively small in a central region of the ribbon beam extracted from the ion source. This enables a beam potential distribution to be averaged in the lateral direction of the ribbon beam. Thus, it becomes possible to reduce a difference in amount of electrons to be drawn in the lateral direction of the ribbon beam, and thus suppress divergence of the ribbon beam at opposite lateral edge regions of the ribbon beam, thereby improving beam transport efficiency.

In some exemplary embodiments, the ion source further comprises a plurality of electrodes for extracting the ribbon beam from the plasma generation container. In such a case, the shielding member may be clamped between the plasma generation container and one of the electrodes disposed closest to the plasma generation container.

In some exemplary embodiments, one of the electrodes disposed closest to the plasma generation container may additionally serve as the shielding member.

An ion implantation apparatus according to various exemplary embodiments includes the above ion source, and a current density distribution adjustor that adjusts a beam current density distribution in the lateral direction of the ribbon beam.

In the implantation apparatus according to the exemplary embodiments, the ion source improved in beam transport efficiency is used, so that it is only necessary for the current density distribution adjustor to locally deflect a small amount of ions. As long as the local deflection amount is small, a large deviation never occurs in the distribution of traveling direction of the ribbon beam at positions in the lateral direction of the ribbon beam, even if uniformity adjustment of the beam current density distribution is performed. This ion implantation apparatus makes it possible to attain a beam current density distribution having high uniformity in the lateral direction of the ribbon beam, and control an ion implantation angle with respect to a board surface, with a high degree of accuracy.

In the ion source according to the exemplary embodiments, elongate holes are formed in the shielding member, and the length of one of the elongate holes located on the central region is set to be shorter than that of one of the remaining elongate holes located on the end portion, so that the beam current becomes relatively small in a central region of the ribbon beam extracted from the ion source. This enables a beam potential distribution to be averaged in the lateral direction of the ribbon beam. Thus, it becomes possible to reduce a difference in amount of electrons to be drawn, in the lateral direction of the ribbon beam, and thus suppress divergence of the ribbon beam at opposite lateral edge regions of the ribbon beam, thereby improving beam transport efficiency.

With reference to FIGS. 1 and 3, the configuration of an ion source according to an exemplary embodiment will now be described.

Figure 2:
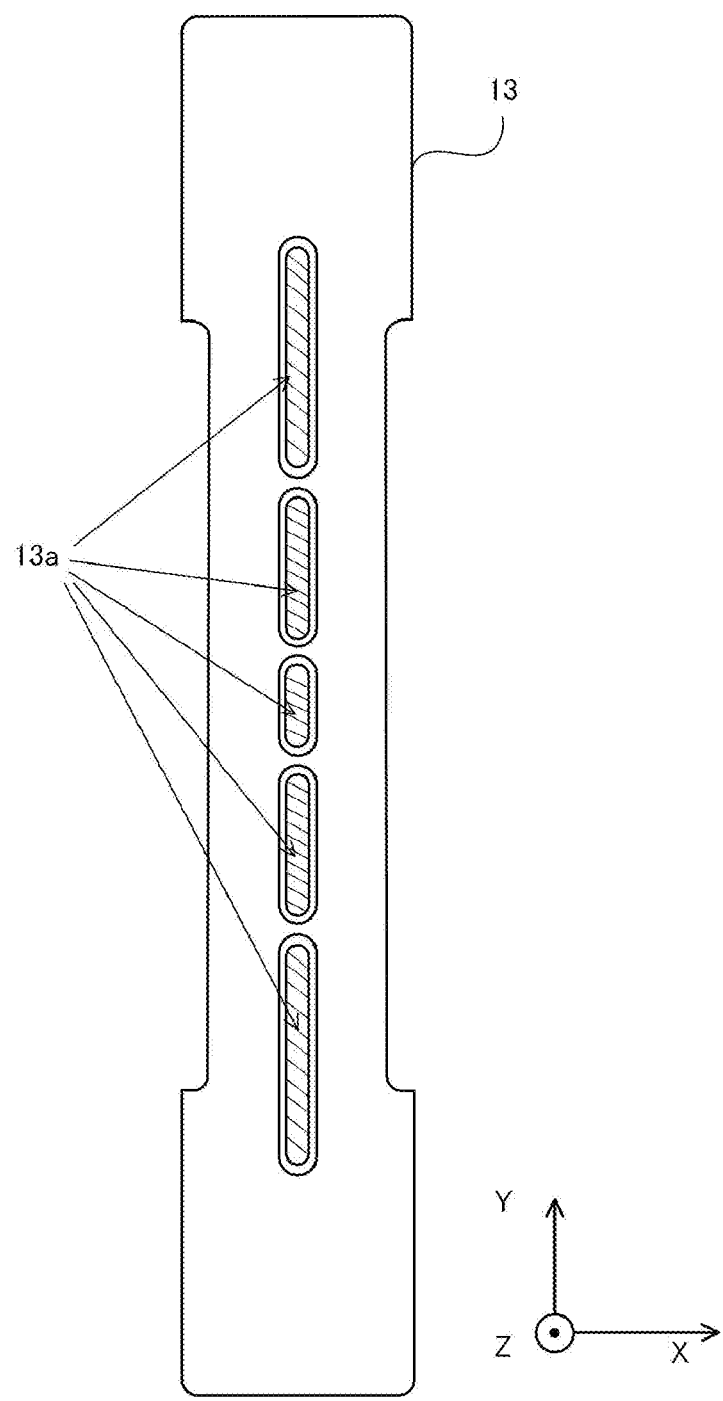
FIG. 2 is a top plan view of a shielding member of the ion source described in FIG. 1.

The ion source 1 is configured to extract a ribbon beam therefrom, and is equipped with a cube-shaped plasma generation container 11 which is long in a Y direction indicated in FIGS. 1 and 2, and is formed with a beam extraction port H in a face thereof. FIG. 1 is a cross-sectional view depicting the ion source, taken along a plane at a central position in a lateral direction of the ion source.

One face of the plasma generation container 11 is provided with a gas introduction port 12 for introducing gas into the plasma generation container 11 therethrough. For example, the gas introduction port 12 may be provided in a top wall of the plasma generation container 11. However, this is only an example and the face on which the gas introduction port 12 is provided is not particularly limited as long as the gas may be introduced into the plasma generation container 11. Further, another face (front or rear wall) of the plasma generation container 11 facing in the Y direction mounts thereon a cathode C, such as a filament, for emitting electrons for ionizing the introduced gas to generate plasma inside the plasma generation container 11. For example, the another face may be a front wall or rear wall of the plasma generation chamber 11. However, this is only an example and the another face is not particularly limited as long as the cathode C may emit electrons for ionizing the introduced gas to generate plasma inside the plasma generation container 11. Furthermore, yet another face of the plasma generation container 11 facing in a Z direction is formed with a beam extraction port H for communication between an inside and outside of the plasma generation container 11. For example, the beam extraction port H may be formed in the bottom face of the plasma generation container 11 in FIG. 1.

This ion source is an electron impact type ion source comprising an electromagnet (not shown) provided outside the plasma generation container 11 to form a magnetic field inside the plasma generation container 11 along a longitudinal (length) direction of the plasma generation container 11.

An extraction electrode system E is disposed downstream of the beam extraction port H (on one side of the beam extraction port H facing in the Z direction). The extraction electrode system is composed of a plurality of electrodes, and configured to extract the ribbon beam through the beam extraction port H by given energy. Although the electrodes composing the extraction electrode system E are called, respectively, an acceleration electrode, an extraction electrode, a suppression electrode and a ground electrode, in this order from the side of the beam extraction port H of plasma generation container 11 extending in the Z direction therefrom, in some cases, there are various other terms. Thus, in this specification, these electrodes will be referred to respectively as "first electrode 14", "second electrode 15", "third electrode 16" and "fourth electrode 17".

Each of the first through fourth electrodes 14 to 17 is formed with one or more openings (14a, 15a, 16a, 17a) for extracting the ribbon beam therethrough.

In the ion source 1 depicted in FIG. 1, a shielding member 13 is disposed at a position that plugs the beam extraction port H of the plasma generation container 11, and formed with a plurality of elongate holes 13a, each of which is long in the Y direction, as described in detail later with reference to FIG. 2.

In this exemplary embodiment, two protrusions P are provided, respectively, on opposite sidewalls of the plasma generation container 11, such that the two protrusions P are opposed to the first electrode 14 in the Z direction. That is, the two protrusions P extend in the X direction parallel to the first electrode 14 as shown in FIG. 1. A coil spring S is provided and extends between each of the protrusions P and the first electrode 14, so that the first electrode 14 is elastically biased toward the plasma generation container 11 by the coil springs S.

The shielding member 13 is clamped between the plasma generation container 11 and the first electrode 14 by the pressure exerted from the coil springs S. That is, no fastening member such as a bolt is used among the plasma generation container 11, the shielding member 13 and the first electrode 14. This configuration makes it possible to prevent seizing of a fastening member under high temperatures and thus improve working efficiency during maintenance involving replacement of components. This configuration also makes it possible to sufficiently release a stress during thermal deformation of the shielding member 13 and/or the first electrode 14.

Regarding the shielding member 13, this exemplary embodiment employs a configuration in which a part 13b of the shielding member 13 is disposed outside the plasma generation container 11. However, in some exemplary embodiments, a configuration may be employed in which the entire shielding member 13 is fitted inside the plasma generation container 11. However, the configuration depicted in FIG. 1 is superior in that, in the event that replacement of the shielding member 13 is needed, replacement work for the shielding member 13 is simplified.

FIG. 2 is an X-Y plan view of the shielding member 13 depicted in FIG. 1. The shielding member 13 is formed with five elongate holes 13*a*. However, this number of holes is only an example, and the number of elongate holes may be, for example, three or more. Each of the elongate holes 13*a* is long in a lateral direction (the Y direction) of a ribbon beam to be extracted therethrough, and the elongate holes 13*a* are arranged in the form of an array extending in the Y direction. Length dimensions (Y-directional dimensions) of the elongate holes 13*a* are set differently depending on respective positions of the elongate holes in the array. Specifically, one or more of the elongate holes located at a central portion of the array is shorter than one or more of the remaining elongate holes located on an end portion of the array. For example, in the exemplary embodiment shown in FIG. 2, a center elongate hole 13*a* is shorter than the remaining elongate holes of the five elongate holes 13*a* in FIG. 2.

Figure 3A:
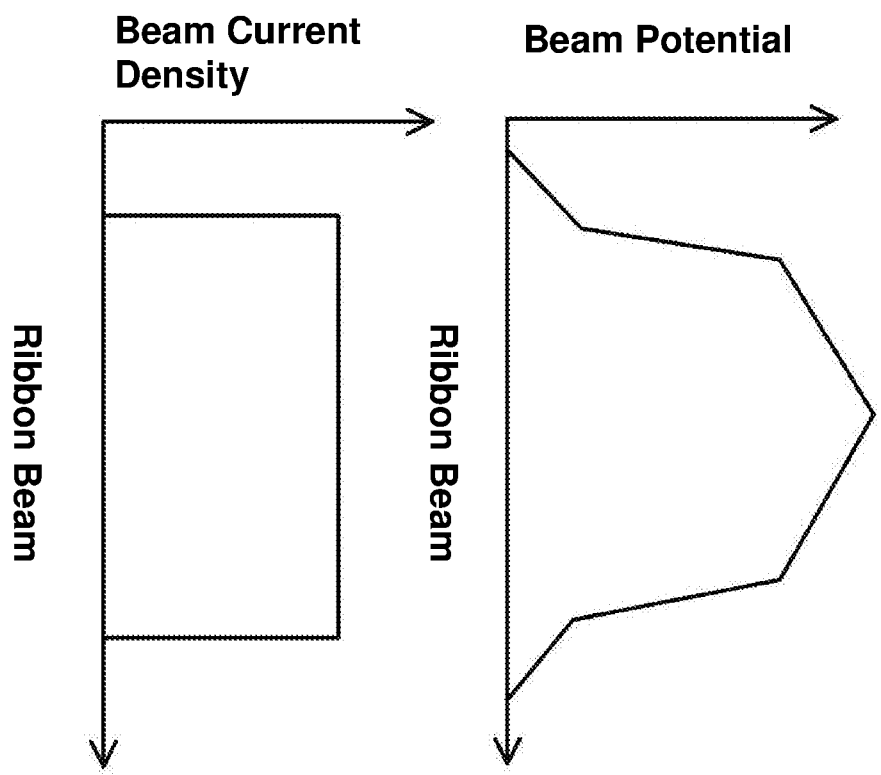
FIGS. 3A and 3B are explanatory diagrams presenting a relationship between a beam current density distribution and a beam potential distribution, with FIG. 3A showing a relationship in the related art and FIG. 3B showing a relationship according to an exemplary embodiment.
Figure 3B:
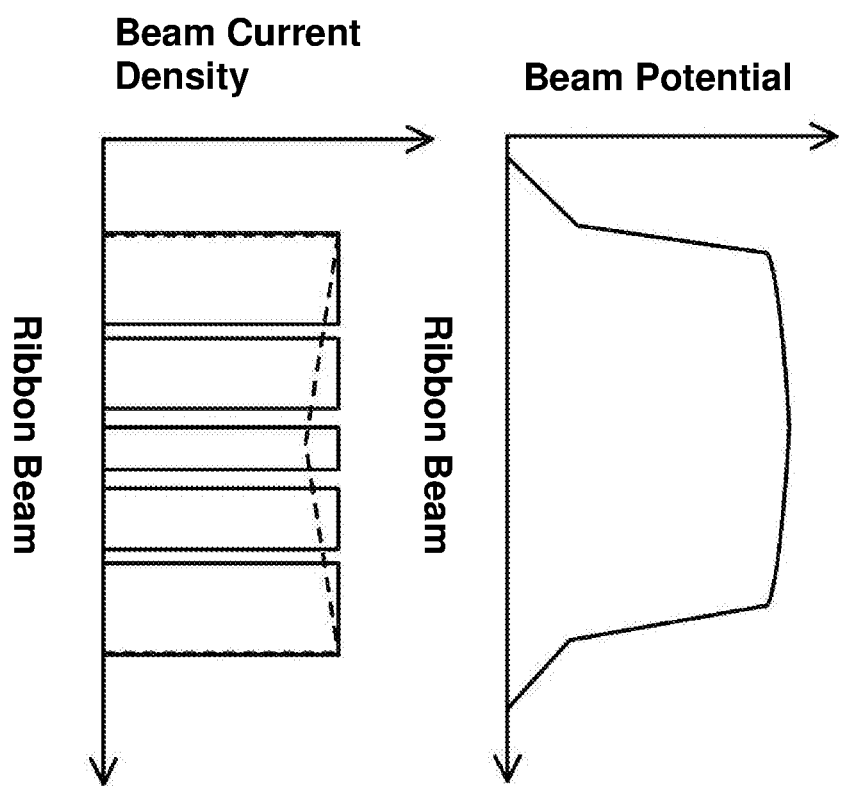

FIGS. 3A and 3B are explanatory diagrams presenting a relationship between a beam current density distribution and a beam potential distribution in the lateral direction of the ribbon beam.

FIG. 3A presents the relationship measured when a ribbon beam is extracted from a single elongate hole as in a related art technique. As presented in FIG. 3A, as long as the beam current density distribution is approximately uniform in the lateral direction of the ribbon beam, the beam potential becomes relatively high in the central region of the ribbon beam, in the nature of the ribbon beam.

FIG. 3B presents a relationship measured when a ribbon beam is extracted from the plurality of elongate holes, according to exemplary embodiments.

In some exemplary embodiments, supposing that each of the openings 14*a* to 17*a* of the electrodes 14 to 17 in the ion source depicted in FIG. 1 is formed as a single hole, the diameter of each of the openings 14*a* to 17*a* has a size which is large enough to cover all the elongate holes 13*a* formed in the shielding member 13.

On the other hand, in other exemplary embodiments, supposing that each of the openings 14*a* to 17*a* of the electrodes 14 to 17 in the ion source depicted in FIG. 1 is formed as a plurality of holes, the plurality of holes forming each of the openings 14*a* to 17*a* correspond, respectively, to the plurality of elongate holes 13*a* formed in the shielding member 13. That is, the holes of each of the openings 14*a* to 17A correspond to the holes 13*a* in a one-to-one relationship.

By setting a relationship between the elongate holes 13*a* of the shielding member 13 and each of the openings 14*a* to 17*a* formed in the electrodes in the above manner, it becomes possible to extract the ribbon beam having the beam current density distribution presented on the left side of FIG. 3B, from the ion source.

The elongate holes 13*a* of the shielding member 13 are formed such that the length of one or more of the elongate holes 13*a* corresponding to the central region of the ribbon beam is shorter than that of one or more of the remaining elongate holes 13*a* corresponding to each of the lateral edge regions of the ribbon beam.

Further, if it is considered that, in a region between adjacent two of the elongate holes in the ribbon beam transport path, two sub-beams extracted from the adjacent elongate holes spread out to fill a gap between the sub-beams, the beam current density distribution indicated by the solid lines may be replaced with the beam current density distribution indicated by the broken lines in FIG. 3B.

In the case where the beam current is reduced in the central region of the ribbon beam as in the beam current density distribution indicated by the broken lines in FIG. 3B, the beam potential is lowered in the central region of the ribbon beam, so that it is possible to enable the beam potential to be averaged over the lateral direction of the ribbon beam to thereby approximately flatten the beam potential distribution. This makes it possible to reduce a difference in amount of electrons to be drawn, in the lateral direction of the ribbon beam, thereby improving beam transport efficiency.

Figure 5:
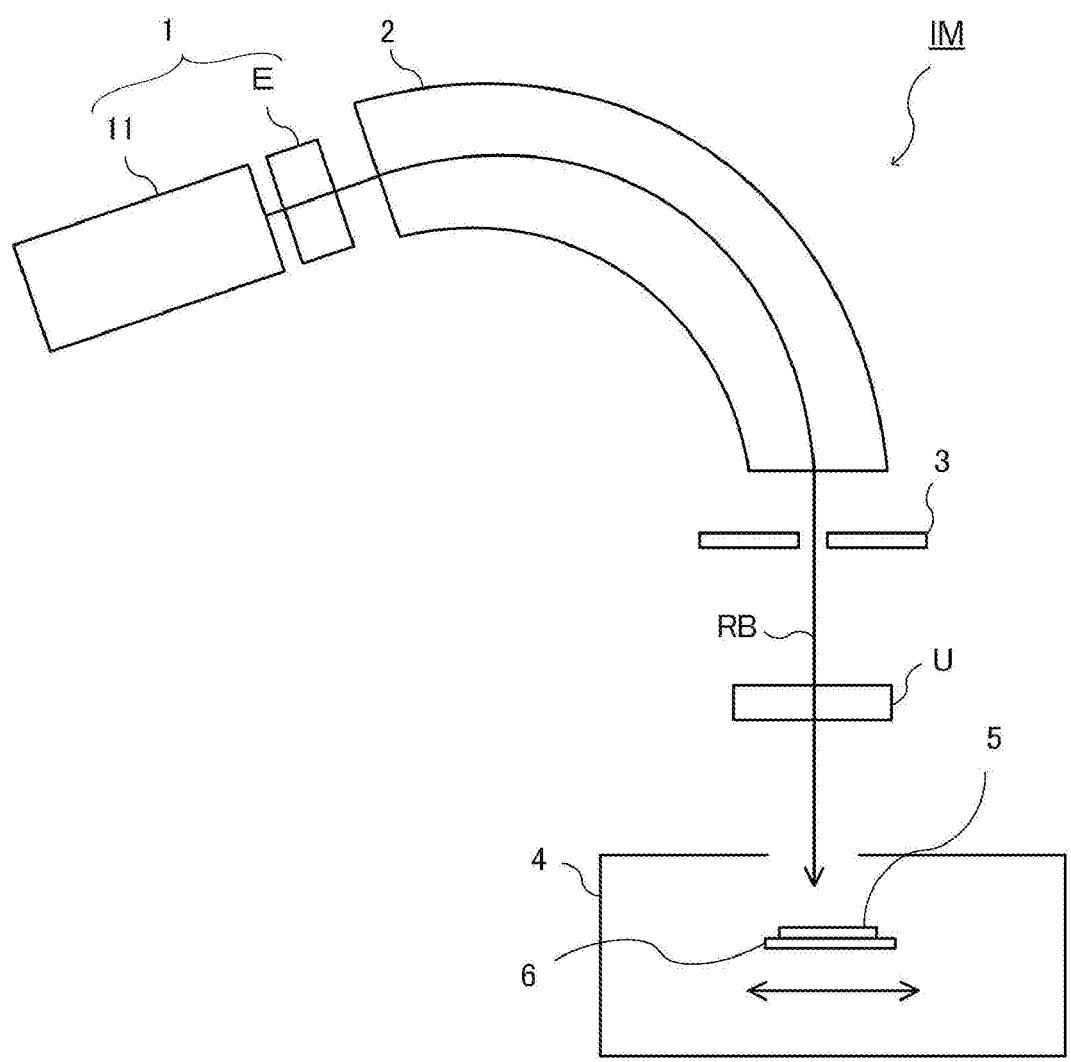
FIG. 5 is a schematic diagram of an ion implantation apparatus according to an exemplary embodiment.

The beam current density distribution and the beam potential distribution presented in FIG. 3B indicate characteristics of the ribbon beam just before the ribbon beam enters a mass analysis electromagnet in an aftermentioned ion implantation apparatus in FIG. 5.

Figure 4:
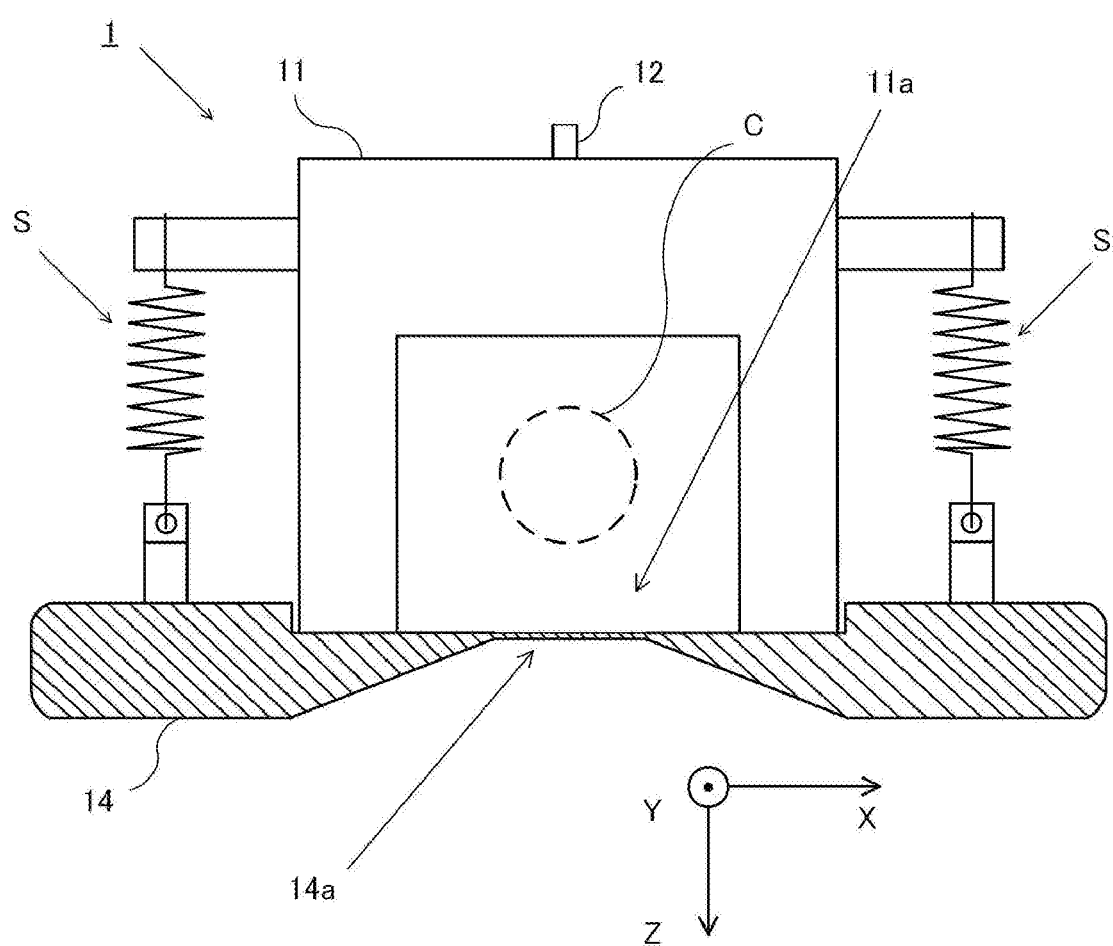
FIG. 4 is a sectional view of a modification of an ion source according to an exemplary embodiment.

It should be noted that the ion source 1 is not limited to the above exemplary embodiment. FIG. 4 depicts a modification of the ion source 1 according to an exemplary embodiment. In the following description of the exemplary embodiment of FIG. 4, description of similar elements or components to those shown in FIGS. 1-3 is omitted for conciseness.

In an ion source 1 depicted in FIG. 4, a first electrode 14 is configured to additionally serve as the shielding member 13 in FIG. 1. In this case, an opening 14*a* of the first electrode 14 is formed as the plurality of elongate holes 13*a* depicted in FIG. 2. This ion source 1 may also obtain the same effects as those in the ion source 1 according to the above exemplary embodiment.

Alternatively, instead of completely removing the shielding member 13 as shown in the exemplary embodiment depicted in FIG. 4, the shielding member 13 and the first electrode 14 in the ion source 1 depicted in FIG. 1 may be integrated together as a single integrated component.

In the course of extracting the ion beam, part of ribbon beam collides with the second electrode 15 to generate secondary electrons. Due to the secondary electrons, the first electrode 14 is subjected to high temperatures, so that breaking or crack is likely to occur in the first electrode. In the configuration depicted in FIG. 1, the shielding member 13 is a member for roughly determining an outer shape of a ribbon beam to be extracted from the ion source. Thus, if breaking or the like occurs in the shielding member 13, stability in shape of a ribbon beam to be extracted through the operation of the ion source is spoiled. Therefore, giving priority to stable extraction of the ribbon beam, it is advantageous that the shielding member 13 and the first electrode 14 are formed as separate components as in the configuration depicted in FIG. 1.

FIG. 5 depicts an ion implantation apparatus IM equipped with an ion source according to an exemplary embodiment. This ion implantation apparatus IM comprises the ion source 1, a mass analysis electromagnet 2, an analysis slit 3, a deflector U, and a process chamber 4. In the process chamber 4, a drive mechanism (not shown) is disposed which is operable to reciprocatingly convey a holder 6 supporting a board 5, such that the holder 6 is moved across a ribbon beam RB in the arrowed direction in FIG. 5.

By using the ion source 1 according to various exemplary embodiments described herein, it becomes possible to suppress disappearance of a part of the ribbon beam at the lateral edge regions in the lateral direction of the ribbon beam, and thus reduce an amount of ions to be locally deflected by the current density distribution adjustor U. As long as the local deflection amount is small, a large deviation never occurs in the distribution of traveling direction (i.e., the Z direction) of the ribbon beam in the lateral direction of the ribbon beam, even if uniformity adjustment of the beam current density distribution is performed.

In a case where the local deflection amount is relatively large as in the related art, there is concern that the deflection effect also exerts an influence in a thickeness (i.e., width) direction (X direction) of the ribbon beam. By contrast, in the ion implantation apparatus employing the ion source according to various exemplary embodiments, the local deflection amount can be sufficiently reduced compared with the related art.

This ion implantation apparatus IM makes it possible to attain a beam current density distribution having high uniformity in the lateral direction of the ribbon beam, and control an ion implantation angle with respect to a board surface, with a high degree of accuracy.

A ribbon beam to be extracted from the elongate holes may be controlled by using the shielding member of the ion source according to the exemplary embodiments, and transported, such that, at an irradiation position of the ribbon beam to a board in the ion implantation apparatus depicted in FIG. 5, traveling directions of the ribbon beam at positions in the longitudinal (lateral) direction of the ribbon beam become approximately parallel to each other, and the beam current density distribution in the longitudinal (lateral) direction of the ribbon beam becomes approximately uniform, as shown in FIG. 3B. This makes it possible to eliminate the need for adjustment by the deflector.

In this case, even if the ion species or energy of a ribbon beam to be extracted from the ion source is changed to give rise to the need for local deflection of the ribbon beam by the deflector, it is only necessary to deflect a small amount of ions. This provides an advantageous effect of being able to lower the capacity of a power supply for the deflector, and for other components.

A current density distribution adjustor U may have a configuration that is capable of locally deflecting the ribbon beam in the lateral direction to adjust the beam current density distribution. Examples of a current density distribution adjustor are disclosed in U.S. Pat. No. 9,734,982 and U.S. Pat. No. 7,078,714, the disclosures of each of which are herein incorporated by reference in their entireties.

For example, the current density distribution adjustor U may comprise a pair of magnetic poles arranged along the longitudinal direction of the ribbon beam to sandwich the ribbon beam therebetween, or a pair of electrodes arranged along the longitudinal direction of the ribbon beam to sandwich the ribbon beam therebetween. The current density distribution adjustor U may adjust a beam current density distribution in the lateral direction of the ribbon beam.

Figure 6:
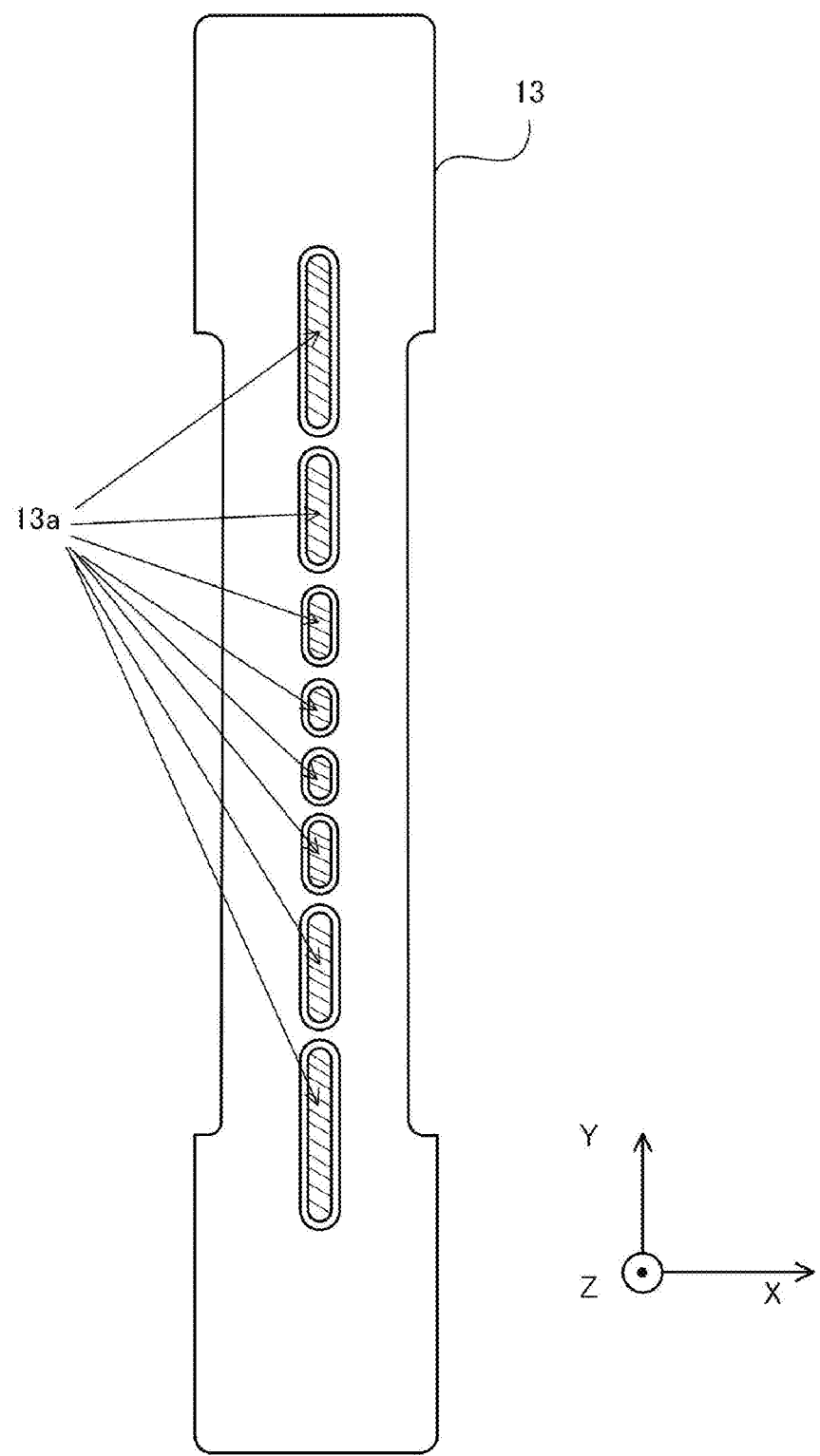
FIG. 6 is a top plan view of a shielding member in a modification of an ion source according to an exemplary embodiment.

In the exemplary embodiments, the number of the elongate holes 13a formed in the shielding member 13 is five. In some exemplary embodiments, the shielding member 13 may be formed with eight elongate holes 13a, as depicted in FIG. 6. From a viewpoint of forming a plurality of elongate holes 13a corresponding to the central region and the opposite lateral edge regions of the ribbon beam, the number of the elongate holes 13a may be three or more. Further, the elongate holes 13a need not be formed along the Y direction, but may be formed while being slightly displaced in the X direction.

It is to be understood that the present disclosure is not limited to the above-described exemplary embodiments, but various other modifications and changes may be made therein without departing from the spirit and scope thereof as set forth in appended claims.

What is claimed is:

1. An ion source comprising:
   a plasma generation container formed with a beam extraction port at an end thereof; and
   a shielding member plugging the beam extraction port and comprising three or more elongate holes each of which is long in a lateral direction of a ribbon beam to be extracted through the shielding member and which are arranged in the form of an array extending in the lateral direction, wherein a first length one of the elongate holes located in a central region of the array is shorter than a second length of one of the remaining elongate holes located on an end side of the array.

2. The ion source as recited in claim 1, further comprising a plurality of electrodes for extracting the ribbon beam from the plasma generation container.

3. The ion source as recited in claim 2, wherein the shielding member is clamped between the plasma generation container and an electrode of the plurality of electrodes that is disposed closest to the plasma generation container.

4. The ion source as recited in claim 2, wherein an electrode of the plurality of electrodes that is disposed closest to the plasma generation container additionally serves as the shielding member.

5. An ion implantation apparatus comprising:
   the ion source as recited in claim 1; and
   a current density distribution adjustor that adjusts a beam current density distribution in the lateral direction of the ribbon beam.

6. The ion implantation apparatus as recited in claim 5, wherein the current density distribution adjustor comprises a plurality of magnetic poles arranged along a longitudinal direction of the ribbon beam to sandwich the ribbon beam therebetween.

7. The ion implantation apparatus as recited in claim 5, wherein the current density distribution adjustor comprises a plurality of electrodes arranged along a longitudinal direction of the ribbon beam to sandwich the ribbon beam therebetween.

8. The ion source as recited in claim 1, further comprising an extraction electrode system.

9. The ion source as recited in claim 8, wherein the extraction electrode system comprise a plurality of electrodes.

10. The ion source as recited in claim 9, wherein the plasma generation container comprises:
    two protrusions that extend from the plasma generation container in parallel with the electrodes, and
    two coil springs, one coil spring provided between each of the two protrusions and an electrode of the plurality of electrodes that is closest to the plasma generation container.

11. The ion source as recited in claim 8, wherein the extraction electrode system includes the shield.

12. The ion source as recited in claim 11, wherein the extraction electrode system comprises a plurality of electrodes and the shield is formed integrally with an electrode of the plurality of electrodes that is closest to the plasma generation chamber.

13. An ion source comprising:
    a plasma generation container including a beam extraction port; and
    a shield provided in the beam extraction port and comprising a first hole, a second hole, and a third hole between the first and second holes, each of the first to third holes having a length that is longer than a width thereof and arranged along a line in a length direction thereof, the length of the third hole being shorter a length of one of the first hole and the second hole.

14. The ion source as recited in claim 13, wherein a part of the shield is disposed outside of the plasma generation container.

\* \* \* \* \*